United States Patent [19]
Dautet et al.

[11] Patent Number: 5,532,474
[45] Date of Patent: Jul. 2, 1996

[54] ACTIVE QUENCH CIRCUIT AND RESET CIRCUIT FOR AVALANCHE PHOTODIODE

[75] Inventors: Henri P. E. G. Dautet; Joseph D. P. DesChamps, both of Québec, Canada

[73] Assignee: EG&G Limited, Vaudreail, Quebec, Canada

[21] Appl. No.: 532,259

[22] Filed: Sep. 22, 1995

Related U.S. Application Data

[63] Continuation of Ser. No. 169,295, Dec. 17, 1993, abandoned.

[51] Int. Cl.$^6$ ..................................................... H01J 40/14
[52] U.S. Cl. .................................... 250/214 R; 327/512
[58] Field of Search .......................... 250/214 R, 214 A, 250/214 C; 307/311; 327/512

[56] References Cited

U.S. PATENT DOCUMENTS

| | | | |
|---|---|---|---|
| 4,303,861 | 12/1981 | Ekstrom | 250/370 |
| 4,762,107 | 8/1988 | Schöneck et al. | 123/478 |
| 4,945,227 | 7/1990 | Jones et al. | 250/214 R |
| 4,963,727 | 10/1990 | Cova | 250/214 R |
| 5,168,154 | 12/1992 | Harley | 250/214 R |
| 5,194,727 | 3/1993 | Johnson et al. | 250/214 R |

*Primary Examiner*—Edward P. Westin
*Assistant Examiner*—Steven L. Nichols
*Attorney, Agent, or Firm*—Lee & Hollander

[57] ABSTRACT

An active quench circuit for interrupting the current flow in an avalanche photodiode (APD) operating in Geiger mode and for resetting the APD. The invention increases the speed of quenching and reduces the time required to bring the APD voltage back to its operating voltage above the breakdown voltage. The circuit includes a small inductor which isolates the reset circuit from the APD during the initial discharge and which provides a current pulse into the APD immediately after the end of the quenching operation to recharge the diode. The reset circuit also includes a diode assembly that increases the speed of the avalanche current pulse and that prevents the circuit from oscillating or latching under certain operating conditions. The circuit presents a low impedance to the APD during during reset, and is much less sensitive to the APD capacitance than prior art circuits.

14 Claims, 2 Drawing Sheets

ACTIVE QUENCH CIRCUIT AND RESET CIRCUIT FOR AVALANCHE PHOTODIODE

"This application is a continuation of Ser. No. 08/169,295, filed Dec. 17, 1993, now abandoned."

FIELD OF THE INVENTION

This invention is related to quenching circuits for use with avalanche photodiodes and in particular to active quenching circuits.

BACKGROUND OF THE INVENTION

The avalanche photodiode (APD) is a semiconductor device that can detect extremely low levels of electromagnetic radiation. Unlike a PIN photodiode, which generally produces a single electron for each photon received, an APD is constructed so that an electron dislodged by a photon will hit other atoms in the silicon of the APD with sufficient velocity and energy so that additional hole-electron pairs are created by the collisions. Typically a free electron will create a number of hole-electron pairs, and the electrons from these pairs will, in turn, create additional electrons, thus creating an "avalanche" process. This multiplication of electrons gives the APD an effective gain and allows detection of very low light levels.

Recent advances in the fabrication and performance of avalanche photodiodes (APD's) have led to their use in the detection of individual photons and other short-duration events. Although APD's have obvious advantages over photomultiplier tubes, including power requirements, size, and quantum efficiency, until recently, photomultiplier tubes have been required to get sufficient sensitivity and speed in these applications. When used in photon detection applications, APD's are frequently used in "Geiger" mode in which the APD is reverse biased with a voltage that exceeds its breakdown voltage. In Geiger mode, some means is necessary to stop or "quench" the current flowing through the diode after each avalanche is triggered by the received EM radiation.

One method to quench the current is to limit the maximum current flowing through the diode, by means of a series resistor, to a low enough level that the current will spontaneously cease due to the statistical nature of the avalanche process. While using simple circuitry, the minimum interval between detectable events is limited by the so-called "dead time," which is the time required to turn off the diode completely and to recharge the diode and parasitic capacitances through the typically large resistance of the current limiting resistor. To this end, various active circuits for quenching the APD current have been developed. Prior art active quenching circuits have been a compromise between the bias above breakdown, the "overvoltage," and the dead time, and are generally more complex than the present invention. The present invention can detect events separated by a few tens of nanoseconds with APD overvoltages on the order of tens of volts.

SUMMARY OF THE INVENTION

Briefly, the invention includes a new active quench circuit for interrupting the current flow in an APD operating in Geiger mode and for resetting the diode. The new circuit detects the leading edge of a current pulse produced by one or more photons impinging upon the active area of the APD and immediately lowers the voltage across the APD to a value below the breakdown voltage. In the present invention, a novel reset circuit is used which increases the speed of quenching and reduces the time required to bring the APD voltage back to its operating voltage above the breakdown voltage. The circuit includes a small inductor which isolates the reset circuit from the APD during the initial discharge and which also provides a current pulse into the diode immediately after the end of the quenching operation to recharge the diode. The reset circuit also includes a diode assembly that provides a high impedance and helps prevent the circuit from oscillating or latching under certain operating conditions. Due to the high impedance presented to the APD during quenching and the low impedance during reset, the circuit of the present invention is much less sensitive to the APD capacitance than prior art circuits.

DESCRIPTION OF THE DRAWINGS

The advantages and operation of the present invention are more fully described in the following description of the preferred embodiment and by reference to the drawings, of which.

DESCRIPTION OF THE PREFERRED EMBODIMENT

Figure 1:
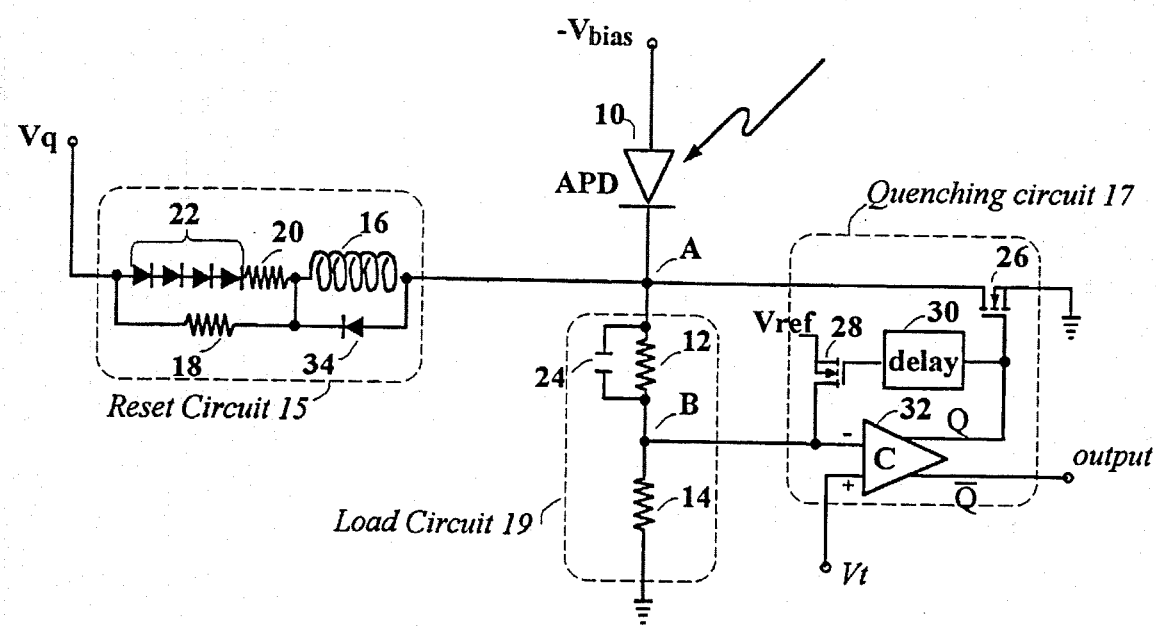
FIG. 1 is a schematic diagram of one embodiment of the invention.

Referring to FIG. 1, a circuit is shown which illustrates the operation of the present invention. In FIG. 1, an avalanche photodiode (APD) 10 is connected between a fixed, negative bias voltage $V_{bias}$ and a node designated in FIG. 1 as A. Node A is connected to a positive voltage $V_q$ by a reset circuit 15 and to ground by a load circuit 19. Node A may also be selectively connected to ground through a FET switch 26, which is part of quenching circuit 17. The operation of these circuits is described below. The negative bias voltage applied to the anode of the APD is selected to be slightly less than the breakdown voltage of the APD. In the described embodiments, which illustrate typical voltage and component values, the APD may be a C3092S or a C3090021S. These diodes have a breakdown voltage $V_{br}$ of 250 volts, and $V_{bias}$ is −245 volts $V_q$ is 30 volts. Other APDs may have different values of $V_{br}$ requiring different values of $V_{bias}$, but may still be used with the circuit of the present invention following the principles described below. The selection of the values of $V_{bias}$ and $V_q$ are discussed more fully below.

Reset circuit 15 includes a resistor 18 and an inductor 16 connected in series between $V_q$ and node A. Resistor 18 has a value of 10 kΩ. Inductor 16 has an impedance of about 10 µH, and it is typically implemented by means of a ferrite bead over a wire conductor. Four series-connected diodes 22 and a 1 kΩ resistor 20 are connected in parallel with resistor 18. This network ensures that the quenching circuit will trigger in the event of a slow avalanche and prevents latching into a continuous APD discharge mode, which might otherwise occur when operating under conditions of low $V_{bias}$, as described in more detail below. A Schottky diode 34 is connected in parallel across inductor 16 and serves to suppress oscillations which might otherwise occur when the switches connected to node A turn on and off.

Load circuit 19 consists of two series-connected resistors 12 and 14 between node A and ground. The values of resistors 12 and 14 are respectively 100 kΩ and 100Ω. A small capacitor 24 of about 3 pF is connected in parallel with 100 kΩ resistor 12 and serves to by-pass the resistor 12 at high frequencies. In particular, capacitor 24 allows the leading edge of the APD avalanche pulse, which has a rise time of a few nanoseconds, to by-pass 100 kΩ resistor 12.

The signal at the junction of resistors 12 and 14, designated as node B in FIG. 1, is applied to the inverting input of a high-speed comparator 32. In the described embodiment, this comparator is an AD9696 circuit with a rise time of approximately 2 nanoseconds. Comparator 32 is part of quenching circuit 17. The non-inverting input of the comparator is connected to a threshold voltage $V_t$, which determines the voltage drop across resistor 14 required to trigger the comparator. It is desirable to make $V_t$ small to initiate the quenching operation early in the avalanche pulse. The exact value of $V_t$ will depend on various parameters of any circuit which embodies the present invention, but $V_t$ will be limited by the noise voltage present at the input to the comparator. The threshold voltage $V_t$ is typically a few mV (2 to 5 mV in the described embodiment) below the DC voltage level set by the voltage divider made of resistors 12, 14, and 18.

The voltage divider in load circuit 19 at the input to the comparator serves two purposes. First, it protects the input circuitry of comparator 32 from high voltages which might otherwise damage the comparator. Second, it ensures that the circuit operates as fast as possible, by keeping the impedance across the inverting input to comparator 32 low to minimize the effects of the comparator input capacitance and other stray capacitance between node B and ground, providing a nearly constant impedance during the comparator switching. Since capacitor 24 by-passes resistor 12, the APD effectively sees a 100 Ω impedance, which allows it to turn on very rapidly.

The positive output of comparator 32 is applied to the gate of FET 26. When comparator 32 is triggered by an avalanche pulse, its output turns on FET switch 26, connecting node A to ground. The output from comparator 32 is also applied to the gate of another FET switch 28 via a delay circuit 30. FET 28 is connected between the input to the comparator and a small positive voltage $V_{ref}$, and it is kept in the open or off state, during quiescent periods by the low comparator output. $V_{ref}$ should be slightly larger than the threshold voltage $V_t$ to ensure that the comparator turns off when FET 28 turns on. In the described embodiment, $V_{ref}$ is approximately 100 mV. After an avalanche pulse is detected by the comparator, the output from delay circuit 30 turns on FET 28, connecting the inverting input of comparator 32 to $V_{ref}$. This forces the comparator output to return low after the delay time, and resets the circuit, as described below. In the described embodiment, delay circuit 38 is a Dallas Semiconductor silicon delay line DS1000.

FET switches 26 and 28 should be high-speed devices. In the described embodiment, these switches are implemented using SST-21 DMOS FET's, which have a rise time of approximately 1 nanosecond. The inverting output of the comparator is used to provide the output from the circuit of FIG. 1 to ensure that the signal applied to the gate of FET 26 is not slowed down by any capacitance that may be associated with the circuitry connected to the output.

The operation of the circuit shown in FIG. 1 will be described with reference to FIGS. 2A, 2B, and 2C, which show waveforms at various points in the circuit. FIG. 2A shows the voltage at node A. FIGS. 2B and 2C show the waveforms at the input (node B) and output of comparator 32, respectively. The horizontal axis is in nanoseconds, and 0 nanoseconds denotes the time at which the APD is hit by a photon.

The breakdown voltage of APD 10 is 250 volts. Since the anode of the APD is kept at −245 volts by $V_{bias}$, the APD will be at its breakdown voltage when node A is at +5 volts. In FIG. 2A, this voltage is shown by the dashed line denoted as $V_{br}$. In FIG. 2B, which shows the voltage at the inverting input of the comparator, the dashed line marked $V_t$ denotes the threshold voltage applied to the comparator non-inverting input.

During quiescent periods when the APD is not conducting, FET 26 in quenching circuit 17 is off, and the reset circuit 15 provides current to node A through series-connected resistor 18 and ferrite inductor 16. (Although a very small "dark current" does flow through the APD during quiescent periods, the dark current is very small, typically on the order of a few tens of pA, and can be disregarded in this description of the operation of the present invention.) The current from the reset circuit flows to node A and then to ground via the two resistors in load circuit 19. Inductor 16 has essentially zero impedance at DC and low frequencies, and the voltage at node A is determined by the voltage divider made up of resistors 12, 14, and 18. Most of the DC voltage drop between $V_q$ and ground is across the 100 kΩ resistor in load circuit 19, and node A will be at a voltage somewhat less than $V_q$, as shown by the waveform in FIG. 2A.

The input to comparator 32 will be at a small positive voltage, as shown in FIG. 2B. For a $V_q$ of 30 volts, the current flowing through resistor 14 during quiescent periods will be about 270 µA, and node B will be at approximately 27 mV. In order to avoid oscillations, the threshold voltage $V_t$ should be set a few millivolts lower than the quiescent voltage at node B. If $V_t$ is 2–3 mV lower than the quiescent voltage at node B, the comparator will trigger when the avalanche current reaches 20 to 30 µA. With no current flowing through the APD, the comparator output is low, as shown in FIG. 2C.

The values of $V_{bias}$ and $V_q$ are selected in the following manner. During quiescent periods, the voltage across the APD is equal to ($V_{bias}+V_q$) minus the voltage drop across resistor 18. In the described embodiment, $V_q$ is 30 volts, and the voltage across APD 10 during quiescent periods is slightly less than 275 volts. The quenching circuit 17 connects node A to ground as soon as an avalanche pulse is detected, and thus the value of $V_{bias}$ sets the voltage across the APD during the quenching period.

Two parameters which are frequently used to characterize an active quenching circuit are (1) the "over-voltage," which is the amount by which the voltage across the APD exceeds the breakdown voltage, and (2) the quenching voltage, which is the amount by which the voltage across the APD is reduced during the quenching operation. In FIG. 2A, the overvoltage is the difference between $V_q$ and $V_{br}$. This voltage is graphically shown as δV in FIG. 2A. The quenching voltage is equal to $V_q$. Although FIG. 1 shows the second terminals of both the load circuit 19 and the quenching circuit 17 connected to ground, this is not essential; and in some applications it may be desirable to connect these terminals to different potentials.

Figure 2:
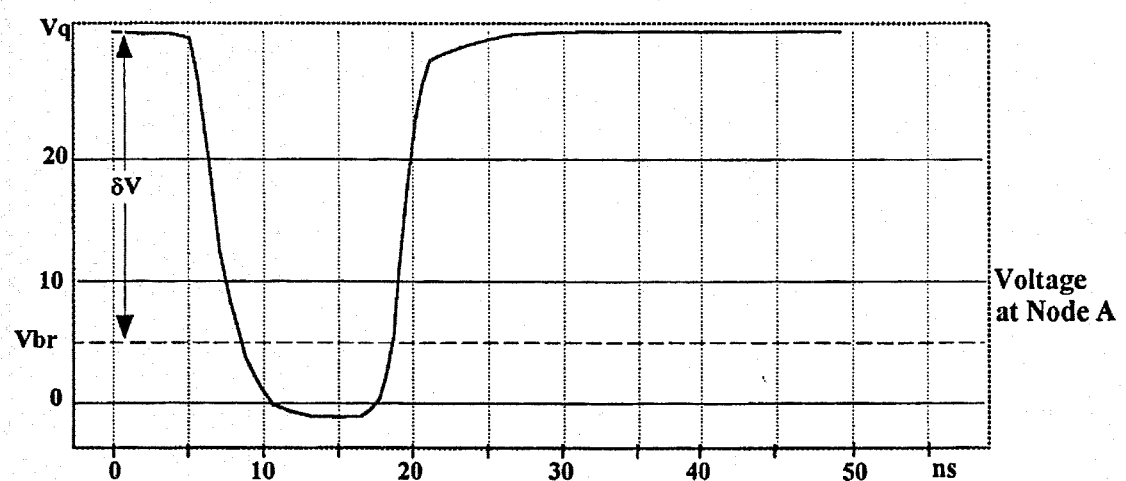
FIGS. 2A, 2B, and 2C show waveforms useful in explaining the operation of the circuit of FIG. 1.
Figure 2:
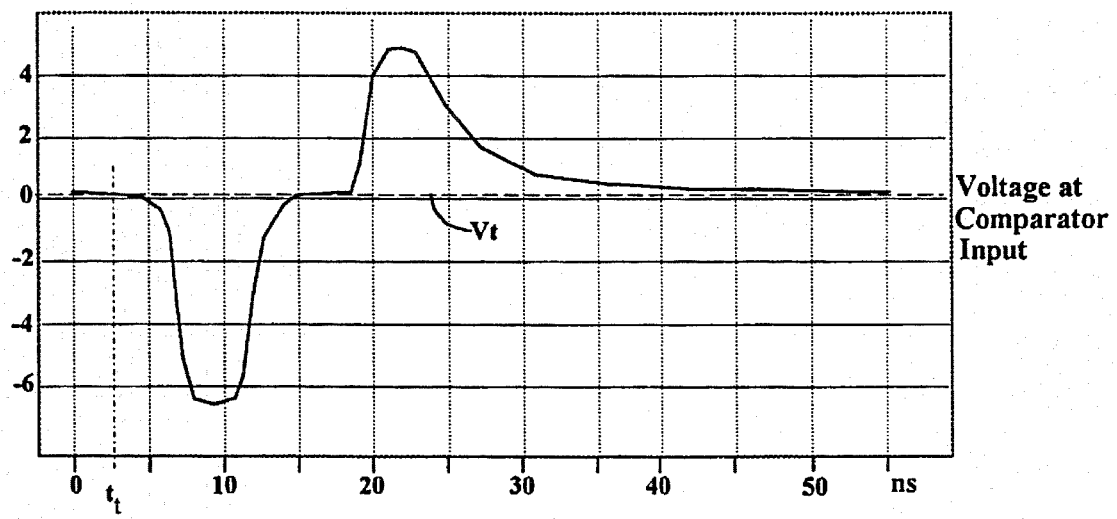
Figure 2:
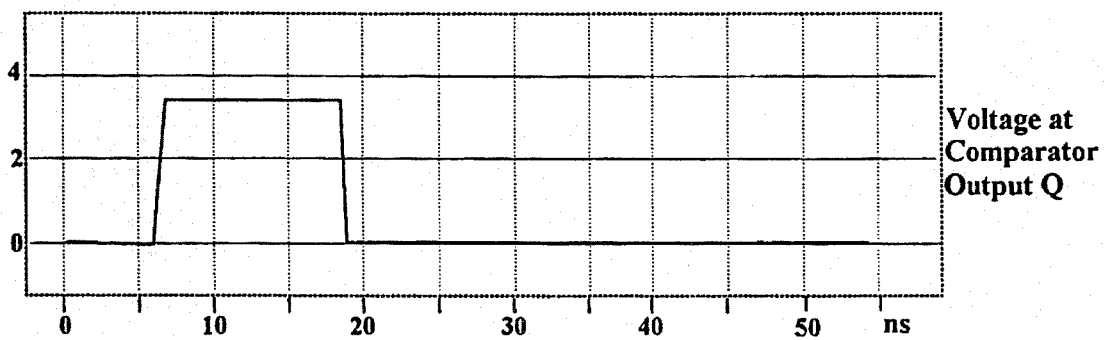

When one or more photons hit the APD to start the avalanche process, the APD begins conducting current within a few nanoseconds. In FIGS. 2, the photon is deemed to arrive at 0 nanoseconds. Due to the extremely fast rise time of the current pulse through the APD, on the order of a few nanoseconds, the impedance of inductor 16 to this pulse is very high and essentially all the avalanche current flowing through the APD is initially supplied by the load circuit 19. Again due to the very fast rise time of the avalanche current pulse, most of the current flows through capacitor 24, by-passing resistor 14. This current produces a voltage pulse across resistor 12 at node B. Since the current flows from ground through the APD to the negative $V_{bias}$ terminal, the voltage pulse will be in the negative direction, as shown in FIG. 2B. This causes the input to the comparator to cross the threshold level $V_t$, which is shown as occurring at time $T_t$ in FIG. 2B. Typical values of $T_t$ for the described circuit are on the order of 2 to 4 nanoseconds.

After the comparator has been triggered, its output will switch within a few nanoseconds, as determined by the propagation delay through the comparator. This is shown in FIG. 2C. The switching time of the FET switch 26 is only a nanosecond or so, and the voltage at node A begins to fall almost immediately after the comparator triggers, as shown in FIG. 2A. The falling voltage at node A is also coupled to the comparator input through capacitor 24, as shown by the −6 volt pulse in the waveform of FIG. 2B, providing positive feedback and ensuring positive switching of the comparator with no oscillation.

The output of comparator 32 returns low after its input is connected to $V_{ref}$ by the output from delay circuit 30 and FET switch 28. This turns off FET switch 26 and allows node A to return to the $V_q$ voltage after the delay period. This delay period should be long enough that the APD avalanche pulse is completely quenched. In the described embodiment the delay period of delay circuit 30 is approximately 10 nanoseconds. The optimal delay time will depend on the parameters of the particular components used in each individual application. The delay circuit may, in some applications be omitted, in which case the delay time is determined by the propogation delays of the circuit components. Sometimes carriers may become trapped within the depletion layer. These traps empty with a temperature and device dependant statistical lifetime and can cause afterpulsing. Because of this, longer delay times may be required in some applications, particularly if low afterpulsing levels are desired. The delay time may be adjusted to optimize the compromise between dead-time and afterpulsing caused by the release of trapped carriers.

It should be noted that the rise and fall times of the voltage at node A are very rapid, being less than 5 nanoseconds in the described circuit. This is much faster than is typically achieved by conventional active quenching circuits and contributes to the performance achieved by the present invention. This is for the following reason.

The depletion region of the APD has no carriers in it during quiescent periods between avalanches. After the APD is triggered by a photon, the number of carriers in the depletion layer rapidly increases as the avalanche current through the diode increases. These carriers have to be removed from the depletion layer before the voltage across the APD can again be raised above the APD breakdown voltage, since any carriers remaining in the depletion layer will trigger another avalanche as soon as the voltage across the APD goes above the breakdown voltage. Thus, to minimize the dead time and maximize retriggering rate of the APD circuit, it is important (1) to initiate quenching (i.e., to turn off the APD) as quickly as possible after an avalanche pulse begins to keep the number of carriers in the depletion region as low as possible, and (2) to recharge the APD capacitance as fast as possible while still ensuring that all carriers remaining in the depletion region are removed. The use of inductor 16, or an equivalent device, in the reset circuit speeds up both of these two operations.

Prior art circuits using conventional reset circuitry have faced the following dilemma. The portion of the APD avalanche current flowing through the load circuit goes up as the impedance presented by the reset circuit to the APD increases. This increases the voltage across the load circuit and the input of the comparator, turning on the quenching circuit more rapidly. On the other hand, the time required for conventional reset circuitry to recharge the APD capacitance increases as the impedance of the reset circuit goes up. This tradeoff has posed a problem for prior art circuits. By using an inductor in the reset circuit of the present invention this tradeoff is avoided. As discussed above, the impedance of inductor 16 is very large at the very high frequency components of the APD avalanche pulse. Thus most of the APD avalanche current is initially blocked by the reset circuit and flows through the load circuit 19. This allows the comparator to detect the avalanche pulse and initiate the quenching operation as quickly as possible. When node A is grounded by FET 26 at the beginning of the quenching period, the current from the reset circuit increases from approximately 270 µA (the quiescent current flowing through the reset and load circuits when APD 10 is off) to about 27 mA ($V_q$ less the drop across diodes 22 over the 1 kΩ resistor 20). When comparator 32 and FET 26 are turned off by delay circuit 30, the current from the reset circuit can no longer flow to ground through FET 26. Inductor 16 will, however, tend to oppose any change in the current flowing through it, producing a current pulse which rapidly recharges the capacitance at node A, including the APD capacitance, capacitor 24, and any stray capacitance. Thus, inductor 16 causes the quenching operation to begin sooner and recharging to occur faster than in prior art circuits.

During quiescent periods when the APD is not conducting, the voltage drop across resistor 18 is not sufficient to forward bias the four diodes in diode assembly 22. When FET 26 turns on, grounding node A, diodes 22 turn on. Since resistor 20 is much smaller than resistor 18, most of the reset period current from reset circuit 15 flows through resistor 20, and thus the value of resistor 20 determines the current level through inductor 16 during the reset and quenching periods. The value of resistor 20 may be adjusted to provide a fast recharge of the APD. Typical values are 200 kΩ.

Additionally, diode assembly 22 provides a variable impedance as a function of the voltage difference between $V_q$ and the voltage at node A. This serves two purposes.

First, it provides a lower impedance to the APD during most of the quenching and reset period. This greatly reduces the sensitivity of the circuit to the APD capacitance. Some prior art circuits are very sensitive to the value of the APD capacitance, requiring adjustment of the circuit to match the APD capacitance to ensure stability. Since the APE) capacitance can vary significantly, even between individual APD of the same type, the present invention's lack of sensitivity to the APD capacitance is a significant advantage.

Second, it prevents latching of the APD in some situations. Under certain conditions, without diodes 20 in the reset network, the circuit of FIG. 1 could latch in an avalanche condition. Some applications require operation of the APD at low overvoltages (δV in FIG. 2A), on the order of 10 volts or less. Additionally, even with higher overvoltages, sudden increases in the counting rates can increase the power dissipated by the APD. The resulting increase in temperature may increase the breakdown voltage of the APD and lower the effective overvoltage at which the circuit is operating. Because the avalanche process is statistical in nature, there is a small but appreciable probability that under low overvoltage conditions the avalanche will develop slowly. For these types of "slow" avalances, about ninety percent of the avalanche current flowing through the APD will come from the reset network instead of the load circuit, since (1) the impedance of inductor 16 is low, (2) capacitor 24 will not by-pass resistor 12, and (3) resistor 18 is about one-tenth the size of the resistance of load circuit 19. Thus, for "slow" avalanches, comparator 32 will not triggered until the avalanche current is about ten times the level required for "fast" avalanches. In other words, for changes in the voltage at node A that are sufficiently slow that inductor 16 and capacitor 24 may be neglected, the voltage at node A will have to decrease by 2 to 3 volts in order to provide the 2 to 3 mV decrease in the voltage at node B required to trigger the comparator, since the voltage divider made up of resistors 12 and 14 has a ratio of 1000 to 1.

During an avalanche, the effective impedance of an APD is approximately inversely proportional to the avalanche current; and during the early stage of an avalanche at low current levels, the APD may have an effective impedance on the order of a few megohms. Without diodes 22, a slow avalanche situation could occur where the voltage at node A drops slowly by less than the voltage required to trigger the comparator, reaching a stable condition where a few hundred μA are flowing through the reset circuit and the APD to $V_{bias}$. This would be similar to a passive quencing circuit using a series-connected resistor too small to limit the current to a low enough value to quench the current. Diodes 22 prevent this from happening by turning on if the voltage at node A drops more than about 2.8 volts below $V_q$. When diodes 22 turn on, the current from reset circuit 15 rapidly increases, and the APD quickly turns completely on. This fast turn on provides the necessary fast pulse required to trigger comparator 32. In this manner, diodes 22 prevent the circuit of FIG. 1 from latching in a stable state where the APD is conducting insufficient current to trigger the comparator.

Figure 3:
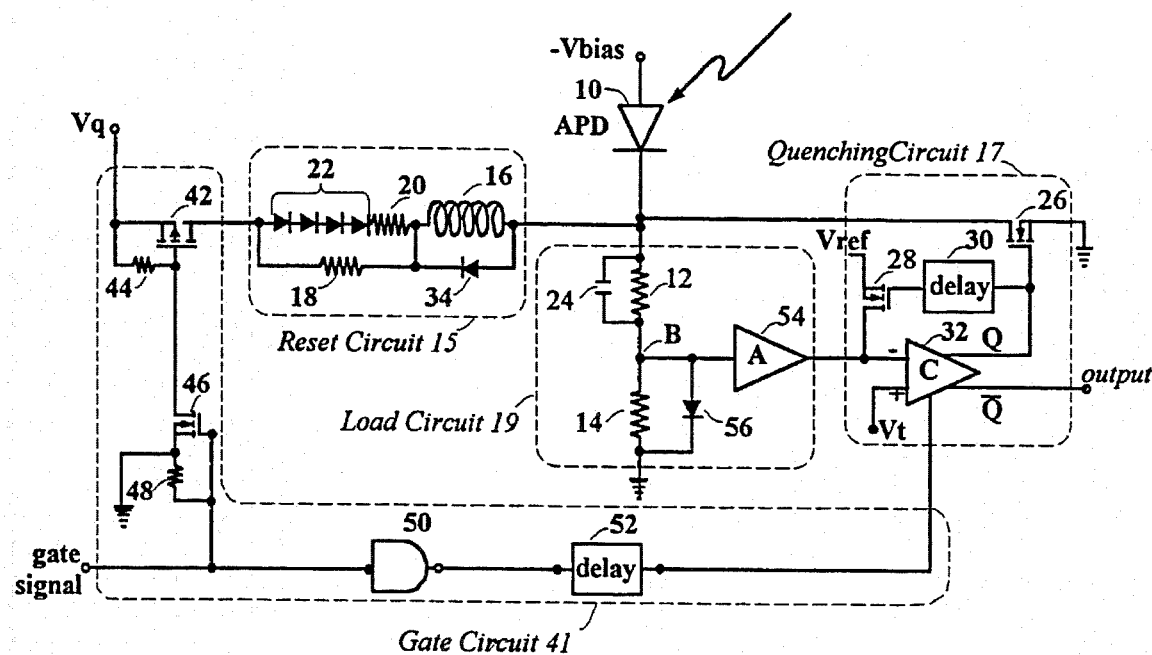
FIG. 3 is a schematic diagram of an alternate embodiment of the invention.

FIG. 3 shows an alternate embodiment of the present invention which includes a gating mode useful in certain applications where the approximate time when a photon will be received is known. For example, in LIDAR anemometry, the velocity of molecules is measured by measuring the arrival time of photons back reflected from the region by individual molecules in the flow. Since the approximate time when these photons will be received by a detector is a short time after the laser is pulsed, the detection circuitry may be disabled during periods between pulses, eliminating spurious background events and dark counts due to electron-hole pairs and noise. Causes of false avalanches include thermally generated hole-electron pairs and noise. FIG. 3 shows one method of gating the circuitry of the present invention in these types of applications. Much of the circuitry in FIG. 3 is the same as previously described with reference to FIG. 1, and the operation of this circuitry is not repeated.

In FIG. 3, a gate circuit 41 is added which enables and disables the circuit. Gain circuit 41 includes a fast FET switch 42 connected between the quench voltage $V_q$ and reset circuit 15. The gate of FET switch 42 is connected to $V_q$ by a resistor 44 and holds FET 42 off until its gate is pulled low. In the described embodiment, FET 42 is a Siliconix VP0610. A normally-low gate signal is applied to the input of a second FET switch 46 connected between the gate of FET 42 and ground. When the gate signal is low, FET 46 is off, turning off FET 42. This disconnects reset circuit 15 from $V_q$ so that it cannot pull the APD cathode above ground. Thus, the voltage across the APD is less than the breakdown voltage, and the APD is no longer in avalanche mode. When the gate signal goes high, FET switch 46 turns on connecting the gate of FET 42 to ground. This turns on FET 42 and connects the reset circuit to $V_q$. Resistor 48 is connected between ground and the gate of FET 46.

The gate signal is also applied via an inverter 50 and a delay circuit 52 to an enable input on comparator 32. When the gate signal is low, the comparator is disabled. Delay 52 provides a delay after the start of the gate pulse before enabling comparator 32. The delay varies depending on the application and is approximately 10 ns in the described embodiment. The delay prevents the comparator from being triggered before the voltage at node A has been fully restored.

A high-speed amplifier 54 may be added between node B and the input to comparator 32, as shown in FIG. 3, to increase the sensitivity and timing accuracy of either of the circuits shown in FIGS. 1 or 3. A diode 56 in parallel with the input to the amplifier provides protection to the input of the amplifier by limiting the amplitude of the input signal.

There has been described a new and useful active quenching circuit which has advantages over previously known circuits. While the operation and advantages of the invention have been described with reference to the exemplary embodiments described above, it should be appreciated that modifications to these embodiments will be made by those of ordinary skill in the art in applying the teachings of the invention to different situations and applications. Accordingly, the present invention should not be limited by the embodiments described above, but rather the scope of the invention should be interpreted in accordance with the following claims.

What is claimed is:

1. A circuit for operating an avalanche photodiode (APD) in Geiger mode, including:

bias means for applying a first voltage to a first terminal of the APD, the first voltage being less than the breakdown voltage of the APD with respect to a reference voltage and having a polarity to reverse bias the APD;

reset means for applying a second voltage to a second terminal of the APD during a first phase of operation, the second voltage being such that the APD is reverse biased above its breakdown voltage when the second voltage is applied to the APD second terminal, the reset means presenting a first impedance to the second terminal of the APD;

means, responsive to a quench signal, for connecting a second impedance between the APD second terminal and the reference voltage during a second phase of operation, the second impedance being less than the first impedance, and for disconnecting the second impedance from the second terminal in the absence of the quench signal; and means for detecting an increase in the current flowing through the APD and for producing the quench signal in response thereto to initiate the second phase of operation, the detecting means being further operative for removing the quench signal after a predetermined delay to terminate the second phase of operation; and wherein the reset means further includes an inductance having a fixed value connected in series between the second voltage and the second terminal of the APD for injecting a current pulse into the APD second terminal immediately following the end of the second phase.

2. The circuit of claim 1 wherein the reset means further includes:
  means for setting the current flowing through the inductance at a first level during the first phase of operation; and
  means for setting the amount of current flowing through the inductance at a second level during the second phase of operation, the second current level being larger than the first current level.

3. The circuit of claim 2 wherein the reset means first impedance includes a DC resistance which is higher than the second impedance and an impedance to AC frequency components which is higher than the DC resistance.

4. The circuit of claim 2 wherein the detecting means includes:
  means for connecting the APD second terminal to a third reference voltage intermediate the bias and second reference voltages and providing a DC resistance between the APD second terminal and the third reference voltage which is much larger than the DC resistance of the first impedance.

5. The circuit of claim 4 wherein the means for connecting includes:
  a first resistor connected to the third reference voltage; and
  a second resistor connected in parallel with a capacitor, the capacitor and second resistor being in series between the first resistor and the APD second terminal, the second resistor being larger than the first resistor;
  and wherein the means for detecting includes means for comparing the voltage at the connection of the first and second resistors to a threshold voltage and for producing the quench signal as a function of said comparison.

6. A circuit for detecting photons, including:
  an avalanche photodiode (APD) having a first terminal connected to a bias voltage and a second terminal connected to a node;
  a load circuit connected between the node and a first reference voltage, the load circuit providing a first DC resistance therebetween;
  quenching circuit means responsive to a quench signal for selectively connecting the node to a second reference voltage in response thereto;
  a reset circuit connected between the node and a third reference voltage, the reset circuit having a second DC resistance less than the first DC resistance and further including an inductance having a fixed value in series between the third reference voltage and the node; and
  means responsive to the current flowing through the load circuit for producing the quench signal in response to an increase therein;
  wherein the bias voltage has a polarity so that the APD is reverse biased when the APD second terminal is connected to any of the first, second, or third reference voltages;
  wherein the bias voltage, the first reference voltage, and the second reference voltage are such that the difference between the bias voltage and either of the first and second voltages is less than the breakdown voltage of the APD; and
  wherein the bias voltage and the third reference voltage are such that the difference therebetween between is greater than the breakdown voltage of the APD.

7. The circuit of claim 6 wherein the quenching circuit means connects the node to the second reference voltage for a predetermined interval, after which the node is disconnected from the second reference voltage.

8. The circuit of claim 7 wherein the load circuit includes a first resistor connected in parallel with a capacitor to provide a load circuit having a DC resistance which is higher than the load circuit impedance at higher frequencies.

9. The circuit of claim 8 wherein the load circuit further includes a second resistor smaller than the first resistor connected in series between the first resistor and second reference voltage; and
  wherein the current responsive means includes means for detecting an increase in the voltage drop across the second resistor and for producing the quench signal in response thereto.

10. The circuit of claim 9 wherein the first and second reference voltages are equal.

11. The circuit of claim 9 wherein the reset circuit includes:
  means for providing a current flow through the inductance and into the node during periods when the node is not connected to the second reference voltage; and
  means for increasing the current flow during periods when the node is connected to the second reference voltage.

12. A method for rapidly quenching and resetting an avalanche photodiode (APD) operating in Geiger mode, including the steps of:
  providing a first reference voltage and a bias voltage, the difference between which exceeds the breakdown voltage of the APD;
  providing a second reference voltage intermediate the bias and first reference voltages such that the difference between the first reference and bias voltages is less than the APD breakdown voltage;
  applying the bias voltage to a first terminal of the APD so as to reverse bias the APD;
  connecting the second terminal of the APD to the first reference voltage through a series-connected inductor having a fixed value;
  initially maintaining the second terminal of the APD at a voltage intermediate the first and second reference voltages and which keeps the voltage across the APD above its breakdown voltage;
  detecting an increase in current flowing through the APD;
  connecting the second terminal of the APD to the second reference voltage through a low impedance switch after said increase in current is detected so that the current flowing through the APD is quenched while current flowing through the inductor is increased; and
  disconnecting the second terminal of the APD from the reference voltage after the current flowing through the APD decreases below a predetermined limit so that the increased current flowing through the inductor flows into the second terminal of the APD, thereby increasing the speed at which the APD capacitance is recharged.

13. The method of claim 12 further including the steps of:
  allowing current to flow through the indicator at a first level during periods when the APD is not conducting; and
  increasing the current flowing through the inductor to a second level larger than the first level during periods when the second terminal of the APD is connected to the reference voltage.

14. The method of claim 13 wherein the step of disconnecting includes the step of waiting for a predetermined interval after said increase in current is detected and the disconnecting the second terminal of the APD for the reference voltage.

* * * * *